Dec. 6, 1966 R. R. SHREVE 3,290,609

DOUBLE FORK, TUNING FORK RESONATOR FILTERS

Filed Jan. 23, 1964 2 Sheets-Sheet 1

INVENTOR.
ROBERT R. SHREVE

BY Darby & Darby

ATTORNEYS

DOUBLE FORK, TUNING FORK RESONATOR FILTERS

Filed Jan. 23, 1964 2 Sheets-Sheet 2

INVENTOR.
ROBERT R. SHREVE
BY Darby & Darby
ATTORNEYS

United States Patent Office 3,290,609
Patented Dec. 6, 1966

3,290,609
DOUBLE FORK, TUNING FORK RESONATOR FILTERS

Robert R. Shreve, Massapequa, N.Y., assignor to Philamon Laboratories, Inc., Westbury, N.Y., a corporation of New York
Filed Jan. 23, 1964, Ser. No. 339,762
7 Claims. (Cl. 330—1)

The present invention relates to tuning fork resonators incorporating two tuning forks, and more particularly to such resonators wherein the electrical connections to the fork drive and pick-up coils are such as to cause the combined output of the fork-generated output to be supplied to the output of the resonator while the leakage signal due, for example, to unavoidable inductive coupling is substantially cancelled by virtue of the electrical connections to the drive and pick-up coils for the two tuning forks.

It is well known to utilize a tuning fork together with electrical driving and electrical pick-up means to form a tuning fork resonator. Such a resonator may be utilized, for example, as a very stable oscillator, and it may also be utilized as a highly frequency-selective filter. Particularly in the latter use of such tuning forks, a problem exists in the unwanted inductive coupling of the input signal supplied to the drive coils across to the pick-up coils of the tuning fork and thence to the output of the resonator. The frequency selectivity of the tuning fork resonator is deteriorated to the extent that there is such an inductively coupled signal from the input to the output, which signal is, of course, not subjected to the high degree of frequency selectivity of the tuning fork mechanism.

Various techniques have previously been used to reduce this inductively coupled background signal. For example, signal bucking or cancelling coils have been used to endeavor to cancel out the inductively coupled signal present between the drive and pickup coils of a tuning fork. While considerable improvement was brought about by various techniques to eliminate inductively coupled signals, these techniques generally introduced added complications in the tuning fork resonator, and notwithstanding the use of these prior techniques a significant inductively coupled signal would still appear at the output of the resonator.

The present invention combines two tuning forks in a single resonator so that the inductively coupled signal from one fork opposes the inductively coupled signal from the other fork. The coils for the two forks are substantially identical as regards inductive coupling so that the inductively coupled signals from the respective forks tend to be nearly (and can be adjusted to be even more precisely equal) so that the inductively coupled signal is reduced to a nearly negligible value.

The use of two forks in the resonator also provides a further advantage in particular filter applications. The tuning fork resonator is inherently a very sharply resonant apparatous with a quality factor or Q typically on the order of several thousand. For many purposes a filter is desired which is less sharply resonant and great difficulty is experienced in reducing the Q of the fork without deleteriously affecting others of its characteristics. As will later be explained in more detail, the use of two forks in a single resonator can simultaneously provide the advantage of elimination of inductive coupling, as previously explained, and also allow one to reduce the Q or selectivity of the resonator without any disadvantageous effect on other characteristics of the resonator.

Briefly then, the invention provides a single resonator having two tuning forks with their various drive and pickup coils interconnected to substantially cancel the inductively coupled signal through the resonator and to provide a vectorial addition of the tuning fork generated signals giving an overall resonator characteristic which is particularly desirable, especially for filter applications in which an exceedingly sharp resonance may be undesirable.

In addition to providing the above described features and advantages, it is an object of the present invention to provide a double-fork tuning fork resonator wherein the problem of inductively coupled background signal from the input to the output of the resonator is substantially eliminated.

It is another object of the present invention to provide such a tuning fork resonator wherein the tuning fork generated signals may be variously combined to provide flexibility with respect to the overall characteristic of the resonator.

It is still another object of the present invention to provide a double tuning fork resonator filter wherein a broader filter response is achieved by virtue of the two tuning forks of the resonator being tuned to very slightly different frequencies.

Other objects and advantages will be apparent from a consideration of the following description in conjunction with the appended drawings in which.

Figure 1:
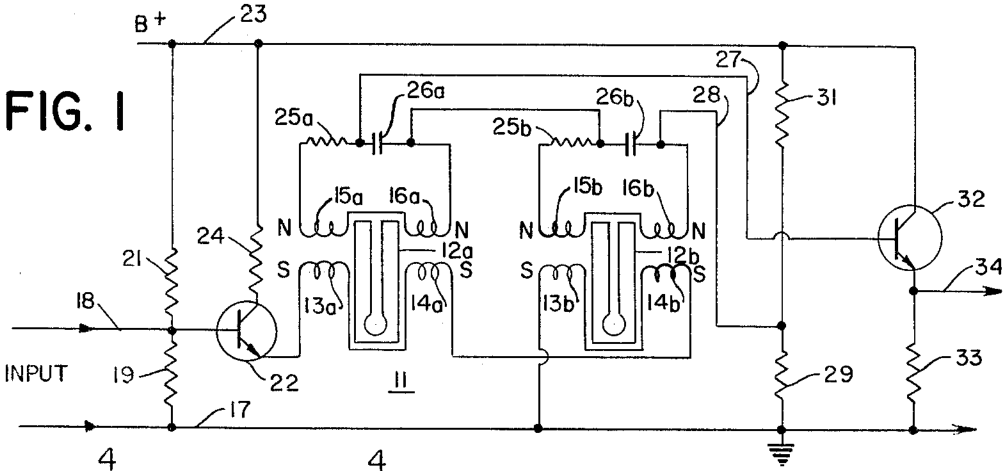
FIGURE 1 is a schematic circuit diagram of a tuning fork resonator and amplifier circuit according to the present invention.

Referring now to FIGURE 1 a double tuning fork resonator 11 is shown. The resonator 11 comprises a first tuning fork 12*a* and a second tuning fork 12*b*.

Tuning fork 12*a* is provided with left-hand and right-hand drive coils 13*a* and 14*a* respectively. Drive coils 13*a* and 14*a* may be, and customarily will be, provided with permanent magnet cores to provide a bias magnetic field. This assures that the magnetic field variation (i.e., the absolute value without regard to polarity) produced by an electrical signal supplied to the coils 13*a* and 14*a* will fluctuate at the same frequency as the electrical signal (rather than twice the frequency as would be the case with no magnetic bias.) Coils 13*b* and 14*b* for driving tuning fork 12*b* will generally be of the same construction, direction of winding, etc., as that described with respect to coils 13*a* and 14*a*.

It may be noted that coils 13*a* and 14*a* comprising the drive coils for tuning fork 12*a* are connected in series. The same is true of coils 13*b* and 14*b* driving tuning fork 12*b*. The series arrangement of the drive coils for each fork will be desirable in certain instances to provide appropriate impedance relations but it may in some cases be desirable to connect the drive coils for each fork in parallel.

It may also be noted that the drive coils 13*a* and 14*a* for tuning fork 12*a* are connected in series with the drive coils 13*b* and 14*b* for tuning fork 12*b*. This series connection could also be replaced by a parallel connection if desired.

In the embodiment of FIGURE 1, coils 13*a* and 14*a* are connected in the opposite sense of coils 13*b* and 14*b* and since the coils for the two tuning forks are otherwise similar, fork 12*a* will be subjected to a driving force 180° out of phase with that of fork 12*b*.

The tuning fork resonators according to the present invention do not necessarily require the use of an amplifier in conjunction therewith but in many instances it will be desired to incorporate one or more amplifiers in the resonator circuit. Obviously the tuning fork resonators alone will have significant transmission loss even for signals at the resonant frequency. For convenience of system design it will frequently be desirable to incorporate sufficient amplification to offset the losses at the resonant frequency of the tuning forks. Accordingly a filter would be provided with zero loss at the center of the filter pass band.

Both pre-amplifier and post-amplifier circuits are illustrated in FIGURE 1. The pre-amplifier comprises a transistor 22 having its base connected to an input lead 18 of the resonator circuit. The other input lead 17 provides the ground lead for the resonator circuit and is in common with the output circuit.

Bias resistors 19 and 21 are connected between the input leads 17 and 18 and a B+ power supply lead 23. The power supply for the amplifiers may be any conventional transistor circuit power supply and frequently the tuning fork resonator filter may utilize the general power supply for a system of which it is a part.

The collector of transistor 22 is connected through a collector resistor 24 to the power supply lead 23. The emitter (and output) of transitor 22 is connected through drive coils 13*a*, 14*a*, 13*b*, and 14*b* to the ground lead 17. Thus the signal applied between input lead 17 and 18 is amplified by transistor 22 and transmitted through the tuning fork drive coils to drive the tuning forks.

Tuning forks 12*a* and 12*b* are provided with pickup coils 15*a*, 16*a*, and 15*b*, 16*b*, respectively. In the particular arrangement shown each tuning fork has a pair of balanced pickup coils arranged adjacent the end of the fork tines and a pair of balanced drive coils placed along the tuning fork close to the pickup coils but somewhat nearer the base of the tuning fork. It should be appreciated that the placement of coils is subject to wide variation within the scope of the present invention. For example one or more of the drive and pickup coils may be eliminated, or the position of the drive and pickup coils can be reversed, or the pickup coil may be placed between or inside the fork tines and numerous other combinations of placement of the coils may be utilized and yet retain, at least in part, the benefits of the present invention.

Ignoring for the moment the other circuit elements in the pickup circuits for the tuning forks, it will be noted that pickup coils 15*a* and 16*a* are connected in series with each other and in series with pickup coils 15*b* and 16*b*. The series combination of pickup coils represents the output of the tuning fork resonator (without post-amplification). This output is supplied by leads 27 and 28 to a post-amplifier circuit which may be of conventional design.

It should be especially noted that the pickup circuit of the tuning fork resonator is provided with capacitors 26*a* and 26*b* which are connected respectively in parallel with the pickup coils 15*a*, 16*a* and the pickup coils 15*b*, 16*b*.

The capacitors 26*a* and 26*b* provide a characteristic in the response of the tuning fork resonators which is difficult or impossible to achieve by previously utilized means.

As has been previously suggested the characteristic of a tuning fork resonator filter is, for many uses, too sharp, or, in other words, has a Q which is too high.

It is known that the Q of the tuning fork can be reduced by damping the fork vibration and that this can be done electrically. It has previously been known for example to place a short circuited coil in the fluctuating magnetic field adjacent the tuning fork or to short circuit a number of turns of the drive or pickup coils. By this means energy would be absorbed from the tuning fork and the vibrations would be effectively damped thus lowering the Q of the tuning fork.

The disadvantage with this previous arrangement is that it requires an extra coil or it requires short circuiting turns of an existing coil, in either case increasing the required size of the winding in proximity to the tuning fork.

On the other hand the capacitors 25*a* and 26*b* provide a means for damping the tuning forks electrically and decreasing the Q which is particularly efficient and does not require additional winding turns in the proximity of the tuning fork. The capacitive reactance of the capacitor 26*a*, for example, is preferably selected to be substantially equal to the inductive reactance of the series pickup coils 15*a* and 16*a* at the frequency of fork vibration. Since the reactance of the capacitor 26*a* is capacitive and the reactance of the coils 15*a* and 16*a* is inductive the impedance of the circuit through coils 15*a* and 16*a* and capacitor 26*a* is generally reduced to the value of the resistances in the circuit, which can be quite small compared to the reactance of the pickup coils. Accordingly a relatively large damping current may be allowed to flow in the circuit including coils 15*a* and 16*a* and capacitor 26*a* which serves to damp the vibration of the tuning fork and lower the Q of the device. It should be noted that the use of a capacitor such as 26*a* in the tuning fork resonator circuit is not limited to a double fork-circuit but may also be utilized in a single-fork resonator circuit.

Resistors 25*a* and 25*b* are provided in the pickup circuits for forks 12*a* and 12*b* to limit the current through capacitors 26*a* and 26*b* and thus control the reduction of Q of the tuning fork resonator. Resistors 25*a* and 25*b* could, if desired, be connected directly in series with the capacitors 26*a* and 26*b* in the shunt portion of the pickup circuit for the tuning fork resonators. The resistance value of resistors 25*a* and 25*b* will naturally depend upon the Q which is desired for the respective tuning forks and in some cases the resistors 25*a* and 25*b* may be omitted. For that matter the capacitors 26*a* and 26*b* are not in any way essential to obtaining the advantages of the double-fork resonator in instances where a double-fork resonator of high Q is desired.

The operation of the post-amplifier circuit in FIGURE 1 is generally similar to the operation of the pre-amplifier previously described. Leads 27 and 28 supply the input to the post-amplifier circuit. Lead 28 is connected to the junction of bias resistors 29 and 31. Bias resistors 29 and 31 are connected in series between the ground lead 17 and the B+ power supply lead 23. Lead 27 is connected to the base of a transistor 32. The collector of transistor 32 is connected to the B+ power supply lead 23. The emitter of transistor 32 is connected through emitter resistor 33 to the ground lead 17, and the output from the circuit is taken from across emitter resistor 33 by way of output lead 34 and ground lead 17.

The operation of each of the tuning forks 12*a* and 12*b* has been generally explained and it is now pertinent to consider the cooperation between these two tuning forks to provide a double tuning fork resonator having particularly desirable characteristics and features.

Figure 5:
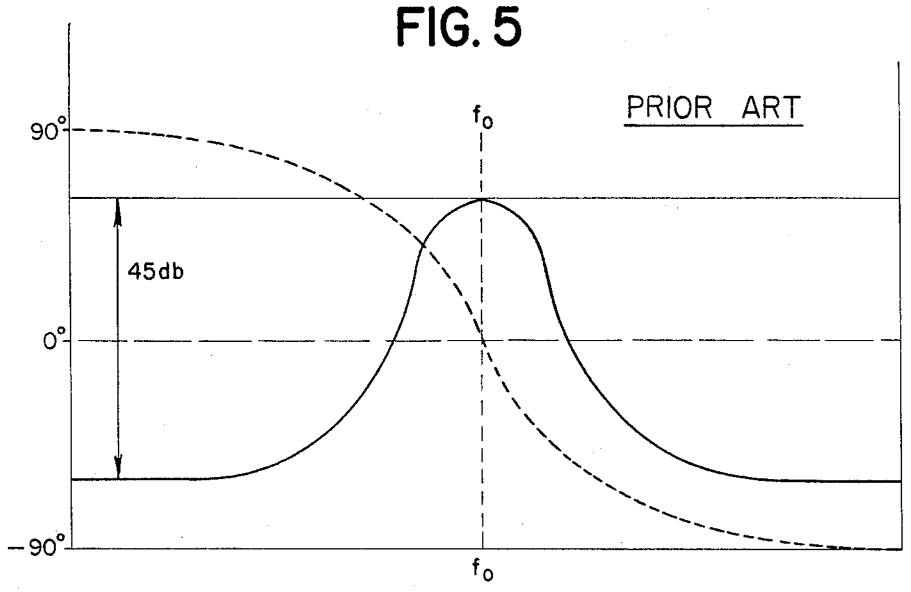
FIGURE 5 is a graph of a typical amplitude characteristic and phase characteristic of a single tuning fork to aid in the explanation of the invention.

Referring to FIGURE 5, a graph is shown therein in which a typical resonance curve is plotted in which the solid line represents signal magnitude (in decibels) versus frequency. If the resonant device were in perfect accord with theory, the magnitude of the signal would continue to drop off on both sides of resonant frequency to virtually a zero value. However, the curve illustrates a practical situation in which a certain amount of unwanted coupling exists which limits the maximum isolation to a value of approximately 45 db. The dashed line in FIGURE 5 is a plot of the relative phase of the input and output signals versus frequency, and it will be noted that for frequencies below the resonant frequency the output leads the input; whereas for frequencies above the resonant frequency the output lags the input. In either case the phase difference approaches 90° as one departs from the resonant frequency. As a rule of thumb, the phase difference will be 45° when the magnitude of the signal is three db down from the maximum.

It will now be pertinent to consider a typical characteristic of the two tuning forks of FIGURE 1 taken together. For the purpose of explanation assume that tuning fork 12*a* is tuned to a frequency slightly lower (for example 0.1% lower) than some reference frequency $f_0$ and that tuning fork 12*b* is tuned to a correspondingly higher frequency approximately 0.1% higher than $f_0$. It may also be assumed for purposes of explanation that the Q of each of the tuning forks has been caused to be approximately 1000 by a selection of appropriate resistors 25*a* and 25*b*.

Figure 6:
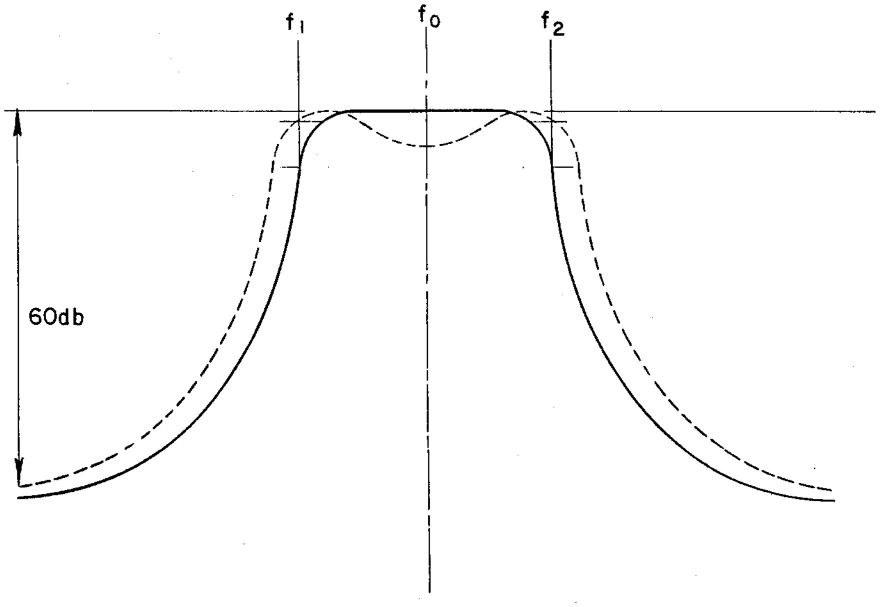
FIGURE 6 is a graph of amplitude characteristics of double tuning fork resonators in accordance with the present invention.

Referring now to FIGURE 6 a plot is shown (solid line) of the response of a double tuning fork resonator filter of the type shown in FIGURE 1 for example. No attempt will be made to give a rigorous analysis of the theory behind the response curve of FIGURE 6. However, one can appreciate the theory of operation in a general way from the following considerations. As previously stated the two tuning forks are tuned respectively approximately one-tenth of one percent above and below a reference frequency $f_0$. It will be further noted that the tuning forks 12*a* and 12*b* are driven in opposition while their pickup coils are connected in the same sense. If there was no phase shift between the input and the output of the respective forks, then their outputs would be in opposition, or 180° out of phase.

However, except at the resonant frequency of each tuning fork, there is a phase shift between the input and the output as indicated generally in FIGURE 5.

Consider first the extreme left-hand portion of the solid curve of FIGURE 6. At these low frequencies, the amplitude of response of each of the tuning forks will be low, furthermore each of the tuning forks will have an output which leads the input in phase by approximately 90° as seen from FIGURE 5. However, it will be noted from FIGURE 1 that there is a transposition of the drive coils of the respective tuning forks so that the actual phase relationship of the outputs provided to leads 27 and 28 will be approximately 180° out of phase. Thus at the extreme left hand of the solid response curve of FIGURE 6 the output of the respective tuning forks is not only of low amplitude but it is also effectively subtractive. The signal at this point will therefore be predominantly due to the very low value of unwanted (e.g., inductive) coupling; the coupling signal is maintained at a low value by self-cancellation as will later be explained in more detail.

As one proceeds from the extreme left of the response curve of FIGURE 6 toward the center of the curve the magnitude incerases sharply as one approaches the frequency $f_1$ which is the resonant frequency of the low-frequency tuning fork. This is due to the fact that the phase relations of the signals produced by the tuning forks is changed so that there is no longer a high degree of cancellation of the two signals. It was previously observed that except for phase shift in the respective tuning forks, their outputs would cancel due to the transposition in the drive coil circuits. At the frequency $f_1$, however, the phase shift in the lower frequency tuning fork has been reduced to zero. There is still a substantial phase shift in the higher frequency tuning fork of a value between 45° and 90°. The resultant output to leads 27 and 28 is therefore the resultant of two signals which are approximately in phase quadrature.

The signals will be exactly in phase quadrature at $f_0$ if it is assumed that the difference between the two fork freqeuncies is arranged so that their individual response curves intersect at the 45° phase shift point. Then at $f_0$ the phase shift of each fork would be 45° but in opposite directions, the relative phase of the two forks not taking into account the transposition in the drive coil circuit would be 90° and taking into account the transposition in the drive coil circuit would be 270°.

The right-hand side of the response curve in FIGURE 6 will be generally symmetric to the left-hand side which has already been explained.

Arranging the difference in the fork frequencies so that the respective phase characteristics of the forks cross at the 45° point (which is also the half power point generally) provides a desirably flat top response as shown in the solid curve of FIGURE 6. However, the fork frequencies can be more widely separated, if desired, at the expense of a dip in the center of the response curve as indicated by the dashed response curve in FIGURE 6.

It should be noted that the double tuning fork frequency response (FIG. 6) more closely approaches an "ideal" bandpass filter characteristic than does the conventional single tuning fork filter. An ideal characteristic would give zero attenuation through the band and, high, preferably infinite, attenuation outside the band.) The single tuning fork filter has a response corresponding to the typical resonance curve. If the Q of the fork is decreased by damping (such as the electrical damping suggested hereinabove), this has the effect of uniformly extending the horizontal scale of the curve without otherwise materially changing the shape of the curve.

Increasing the Q and broadening the bandwidth by the damping technique also causes the slope of the response curve at any given portion thereof to be reduced (in absolute value). And while the frequency range of signals "accepted" by the filter is increased, there is also an increased acceptance, that is less rejection, of the unwanted signals close to the pass band of the filter.

In contrast, the double fork filter whose response is illustrated in the solid line in FIG. 6 achieves a wider pass band without sacrificing the capability for rejection of unwanted signals close to the filter pass band. This is true because in the case of the response illustrated in FIG. 6 there is no general enlargement of the horizontal scale as respects the response curve. Rather an essentially flat segment is inserted in the center of the response curve while the wings of the curve remain essentially as steep as that of a single one of the tuning forks. Thus the pass band is increased without sacrificing rejection of unwanted signals near the band. To use a numerical example, the rejection for the double fork may be for frequences different from $f_0$ by $\Delta f$, 3 db; by $2\Delta f$, 15 db; by $4\Delta f$, 27 db. In the case of a single tuning fork the rejection would be for frequencies different from $f_0$ by $\Delta f$, 3 db; by $2\Delta f$, only 9 db; by $4\Delta f$ only 15 db.

The use of two tuning forks approximately doubles the 3 db pass band of the filter, but of course, higher multiples could be obtained by the use of a greater number of electrically coupled forks (usually an even number).

The circuit of FIGURE 1 also serves to greatly diminish the unwanted coupling in the output of the tuning fork resonator. This is brought about by the transposition in the drive coil circuit. Since the individual tuning forks and circuits are virtually identical, the unwanted coupling in each circuit will be substantially the same and will cancel in the output to leads 27 and 28.

The particular arrangement of FIGURE 1 as respects the connection of coils, magnet polarities, and the like is subject to numerous variations. Obviously the advantages of FIGURE 1 can also generally be obtained by driving the forks in unison and placing a transposition in the pickup circuit for the two forks. In such case the electrical signals would be substantially the same at the output and the principal difference would be that the mechanical vibration of the two forks would tend to be in unison rather than in opposition (disregarding phase shifts due to the resonant characteristic of the forks).

While the arrangement that the forks be provided with a transposition in either the output or the input to cancel or tend to cancel the fork ouput signal for frequencies widely removed from the center frequency is very useful in certain applications, it is not necessary to so provide off-frequency cancellation of the fork-induced signal in order to provide the desired cancellation of the unwanted coupling signal due to induction or the like. Without going into the details of the innumerable combinations of windings and polarity, it may be noted that reversing the winding of any coil or set of coils reverses both the electromechanical effect of the coil and also reverses the inductive effect of the coil. On the other hand reversing the magnetic bias in a particular coil reverses the electromechanical effect but does not reverse the inductive effect. Obviously reversing the connections to a coil is tantamount to reversing the winding. With these principles in mind, it is possible to provide innumerable combinations of coil winding, magnetic bias polarity, and coil connection. Thus the inductive coupling from the two individual tuning fork resonator circuits can be made to be in opposition whether the tuning fork signals are nominally in opposition or in unison.

The physical arrangement of the tuning forks 12*a* and 12*b* is not critical in order to obtain the general advantages of the invention. However, a specific arrangement is illustrated in FIGURES 2, 3, and 4 which may be advantageous in special circumstances.

Figure 2:
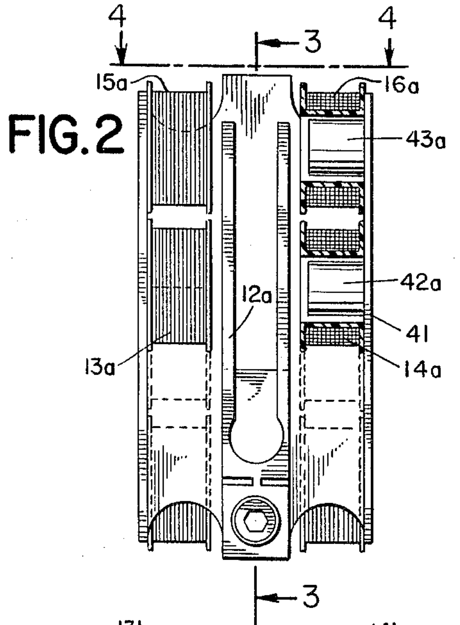
FIGURE 2 is a top plan view of double tuning fork structure with drive and pickup coils in accordance with the present invention.
Figure 3:
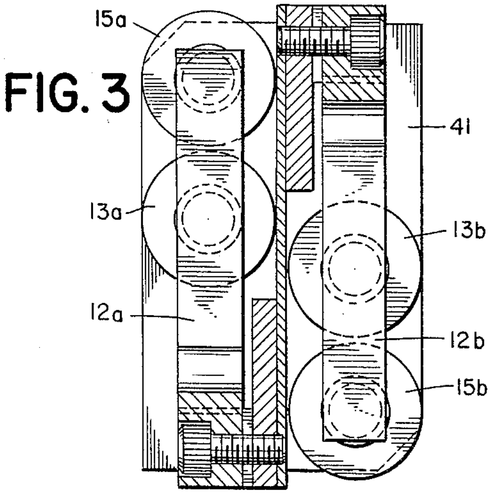
FIGURE 3 is a sectional view of the structure of FIGURE 2 taken along the line 3—3 in FIGURE 2.
Figure 4:
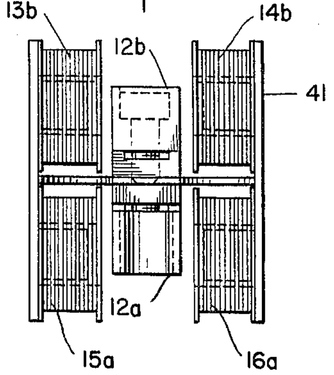
FIGURE 4 is an elevational view of the structure of FIGURE 2 taken along the line 4—4 in FIGURE 2.

Referring to FIGURES 2, 3, and 4 a base 41 is shown on which are mounted tuning forks 12*a* and 12*b*. The forks are mounted in a position which might be described as back-to-back and head-to-foot. Coils 15*a*, 16*a* and 15*b*, 16*b* are placed near the end of the tuning fork tines for maximum sensitivity. The electrical connections to the coils are omitted from FIGURES 2 through 4 for clarity as they may more readily be ascertained by reference to the circuit diagram of FIGURE 1.

Coils 13*a*, 13*b*, 14*a*, and 14*b* are placed near the center of the fork tines. Note that these coils may be placed very close to pickup coils 15*a*, 15*b*, 16*a*, and 16*b* and that there need be no inductive shielding therebetween since the inductive effects of the two tuning fork circuits effectively cancel out in the output of the device.

The coils are all provided with small permanent magnet cores to produce a magnetic bias and coils 14*a* and 16*a* have been illustrated as cut away to show their respective permanent magnets 42*a* and 43*a*.

The head to toe arrangement of the tuning forks in FIGURE 2 is such that any variation in frequency due to an acceleration lengthwise of the tuning fork causes an increase in frequency in one fork and a decrease in frequency in the other fork. Thus the center frequency of the double fork arrangement would remain unchanged in the presence of acceleration; however the bandwidth of the response would be varied slightly due to the shift in frequency of the forks.

The physical arrangement of forks illustrated in FIGURES 2, 3, and 4 is only exemplary and of course the forks may be physically mounted completely independently or may be mounted head-to-head and foot-to-foot or in any other desired fashion.

From the foregoing explanation, it will be seen that a double tuning fork resonator has been provided which has particularly desirable characteristics especially for use as a tuning fork resonator filter. Numerous variations and modifications to the particular form of the invention shown will be obvious to those of skill in the art, in addition to those variations shown and suggested herein. Accordingly it is desired that the scope of the invention not be limited to those forms of a device illustrated or suggested, but that it be determined by reference to the appended claims.

What is claimed is:

1. A tuning fork resonator comprising a first tuning fork, a second tuning fork, drive means for each said fork, pickup means for each said fork, means coupling said drive means to receive a drive signal from a common source and means coupling said pickup means to provide a signal to a common output with the signal due to stray coupling between said drive means and said pickup means of said first tuning fork in an opposite sense to and substantially cancelling the signal due to stray coupling between said drive means and said pickup means of said second tuning fork.

2. A tuning fork resonator comprising a first tuning fork, a second tuning fork, drive means for each said fork, pickup means for each said fork, means coupling said drive means to receive a drive signal from a common source and means coupling said pickup means to provide a signal to a common output with the connection between said pickup means of said first and second tuning forks being in an opposite sense relative to the connection between said drive means of said first and second tuning forks.

3. A tuning fork resonator comprising a first tuning fork, a second tuning fork, having a slightly different resonant frequency from that of said first tuning fork, drive means for each said fork, pickup means for each said fork, means coupling said drive means to receive a drive signal from a common source and means coupling said pickup means to provide a signal to a common output with the signal due to stray coupling between said drive means and said pickup means of said first tuning fork in an opposite sense to and substantially cancelling the signal due to stray coupling between said drive means and said pickup means of said second tuning fork.

4. A tuning fork resonator and amplifier comprising a first turning fork, a second tuning fork having a slightly different resonant frequency from that of said first tuning fork, first drive means for said first tuning fork, second drive means for said second tuning fork, first pickup means for said first tuning fork, second pickup means for said second turning fork, means coupling said first and second drive means to receive a drive signal from a common source and to drive said first and second tuning forks, and means coupling said pickup means to provide a signal to a common output with the inductive coupling from said first drive means to said first pickup means in opposition to the inductive coupling from said second drive means to said second pickup means, whereby the signal from said pickup means due to vibration of said tuning forks is vectorially added and the signal due to the stray coupling between said drive means and respective ones of said pickup means are in an opposite sense and substantially cancel in the output of said resonator.

5. A tuning fork resonator and amplifier comprising a first tuning fork, a second tuning fork, first drive means for said first tuning fork, second similar drive means for said second tuning fork, first pickup means for said first tuning fork, second similar pickup means for said second tuning fork, means coupling said first and second drive means in series to receive a drive signal from a common source and to provide driving forces for said first and second tuning forks which are in unison, means coupling said pickup means in opposition to provide a signal to a common output, and an amplifier for amplifying the signal from said common source supplied to said drive means, whereby the signal from said pickup means due to vibration of said tuning forks is vectorially added and the signal due to the stray coupling between said drive means and respective ones of said pickup means are in an opposite sense and substantially cancel in the output of said resonator.

6. A tuning fork resonator and amplifier comprising a first tuning fork, a second tuning fork having a slightly different resonant frequency from that of said first tuning fork, a first drive coil for said first tuning fork, a second similar drive coil for said second tuning fork, a first pickup coil for said first tuning fork, a second similar pickup coil for said second tuning fork, means coupling said first and second drive coils in series to receive a drive signal from a common source and to drive said first and second tuning forks in unison, means coupling said pickup coils in opposition to provide a signal to a common output, and an amplifier for amplifying the signal from said common source supplied to said drive coils, whereby the signal from said pickup coils due to vibration of said tuning forks is vectorially added and the signal due to the stray coupling between said drive coils and respective ones of said pickup coils are in an opposite sense and substantially cancel in the output of said resonator.

7. A tuning fork resonator and amplifier comprising a first tuning fork, a second tuning fork having a slightly different resonant frequency from that of said first tuning fork, first drive means for said first tuning fork, second similar drive means for said second tuning fork, a first pickup coil for said first tuning fork, a second similar pickup coil for said second tuning fork, means coupling said first and second drive means in series to receive a drive signal from a common source and to drive said first and second tuning forks in unison, means coupling said pickup coils in opposition to provide a signal to a common output, respective capacitors in parallel with each of said pickup coils, and an amplifier for amplifying the signal from said common source supplied to said drive means, whereby the signal from said pickup coils due to vibration of said tuning forks is vectorially added and the signal due to the stray coupling between said drive means and respective ones of said pickup coils are in an opposite sense and substantially cancel in the output of said resonator.

References Cited by the Examiner

Holt: Tuning Fork for High-Q Resonance, p. 108, Electronics, May 20, 1960.

O'Connor: A 400-C.P.S. Tuning Fork Filter, pp. 1857–65, Proc. of the IRE, November 1960.

O'Connor: Tuning-Fork Audio Filter Tunes Electrically, pp. 66–67, Electronics, Dec. 2, 1960.

ROY LAKE, *Primary Examiner.*

F. D. PARIS, *Assistant Examiner.*